United States Patent
Kim et al.

(10) Patent No.: US 8,957,799 B1
(45) Date of Patent: Feb. 17, 2015

(54) CURRENT MEMORY CELL AND A CURRENT MODE DIGITAL-TO-ANALOG CONVERTER INCLUDING THE SAME

(71) Applicant: Samsung Display Co., Ltd., Yongin, Gyeonggi-Do (KR)

(72) Inventors: Bo-Yeon Kim, Yongin (KR); Oh-Jo Kwon, Yongin (KR); Hee-Sun Ahn, Yongin (KR); Won-Tae Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/207,820

(22) Filed: Mar. 13, 2014

(30) Foreign Application Priority Data

Aug. 22, 2013 (KR) .......................... 10-2013-0099565

(51) Int. Cl.
    *H03M 1/66* (2006.01)
    *G11C 11/406* (2006.01)
(52) U.S. Cl.
    CPC .......... *G11C 11/40615* (2013.01); *H03M 1/66* (2013.01)
    USPC .......................................... 341/150; 341/144
(58) Field of Classification Search
    USPC ................. 341/144, 150; 365/185.44, 185.24, 365/185.28
    See application file for complete search history.

(56) References Cited

U.S. PATENT DOCUMENTS

| 5,296,752 | A | * | 3/1994 | Groeneveld et al. ............. 327/91 |
| 5,400,273 | A | | 3/1995 | Hughes et al. |
| 5,793,231 | A | * | 8/1998 | Whittaker ....................... 327/95 |
| 6,486,816 | B2 | | 11/2002 | Seymour |
| 7,894,225 | B2 | * | 2/2011 | Park ................................. 365/45 |

FOREIGN PATENT DOCUMENTS

| EP | 0 925 588 | 11/2002 |
| JP | 06-236697 | 8/1994 |
| KR | 20000036128 | 6/2000 |

* cited by examiner

*Primary Examiner* — Brian Young
(74) *Attorney, Agent, or Firm* — F. Chau & Associates, LLC

(57) ABSTRACT

A current memory cell includes an amplifier, transistor, first and second capacitors, and first to third switching units. The amplifier includes first to third terminals. The transistor is coupled to first and second nodes, and ground. The first capacitor is coupled between the second node and ground. The second capacitor is coupled between a third node and ground. The first unit couples a current source to the first node during a first period and an output line to the first node during a second period. The second unit couples the first node to the second node during the first period. The third unit couples the first terminal to the second node and couples the second and third terminals to the third node during the first period, and couples the first terminal to the third node and couples the second and third terminals to the second node during the second period.

20 Claims, 4 Drawing Sheets

CURRENT MEMORY CELL AND A CURRENT MODE DIGITAL-TO-ANALOG CONVERTER INCLUDING THE SAME

CROSS-REFERENCE TO RELATED APPLICATION

This application claims priority under 35 U.S.C. §119 to Korean Patent Application No. 10-2013-0099565, filed on Aug. 22, 2013, in the Korean Intellectual Property Office, the disclosure of which is incorporated by reference herein in its entirety.

TECHNICAL FIELD

The present invention relates to a current memory cell and a current mode digital-to-analog converter including the same.

DISCUSSION OF THE RELATED ART

A current memory cell is a unit circuit for supplying a constant current to another circuit. The current memory cell may periodically perform a refresh to supply the constant current.

For example, the current memory cell periodically receives a reference current supplied from a reference current source during predetermined period, e.g., a refresh period, to charge a voltage in a capacitor or the like within the current memory cell. After the refresh period, the current memory cell supplies a constant current to the outside, using the charged voltage.

SUMMARY

An exemplary embodiment of the present invention provides a current memory cell and a current mode digital-to-analog converter including the same, which can decrease a refresh period.

According to an exemplary embodiment of the present invention, there is provided a current memory cell, including: an amplifier including a first input terminal, a second input terminal and an output terminal; a transistor including a source electrode coupled to a first node, a drain electrode coupled to a ground, and a gate electrode coupled to a second node; a first capacitor coupled between the second node and the ground; a second capacitor coupled between a third node and the ground; a first switching unit configured to couple a reference current source to the first node during a first period and couple an output line to the first node during a second period; a second switching unit configured to couple the first node to the second node during the first period; and a third switching unit configured to couple the first input terminal of the amplifier to the second node and couple the second input terminal of the amplifier and the output terminal of the amplifier to the third node during the first period, and couple the first input terminal of the amplifier to the third node and couple the second input terminal of the amplifier and the output terminal of the amplifier to the second node during the second period.

The first period may be a period in which a first control signal is supplied, and the second period may be a period in which a second control signal is supplied.

The first switching unit may include a first switching element coupled between the reference current source and the first node, the first switching element configured to be turned on in response to the first control signal; and a second switching element coupled between the output line and the first node, the second switching element configured to be turned on in response to the second control signal.

The second control signal may be an inversion signal of the first control signal.

The second switching unit may include a third switching element coupled between the first and second nodes, the third switching element configured to be turned on in response to the first control signal.

The third switching unit may include a fourth switching element coupled between the second node and the first input terminal of the amplifier, the fourth switching element configured to be turned on in response to the first control signal; a fifth switching element coupled between the third node and the first input terminal of the amplifier, the fifth switching element configured to be turned on in response to the second control signal; a sixth switching element coupled between the second node and the second input terminal of the amplifier, the sixth switching element configured to be turned on in response to the second control signal; a seventh switching element coupled between the third node and the second input terminal of the amplifier, the seventh switching element configured to be turned on in response to the first control signal; an eighth switching element coupled between the second node and the output terminal of the amplifier, the eighth switching element configured to be turned on in response to the second control signal; and a ninth switching element coupled between the third node and the output terminal of the amplifier, the ninth switching element configured to be turned on in response to the first control signal.

The current memory cell may further include an inverter configured to generate the second control signal by inverting the first control signal.

The capacitance of the second capacitor may be greater than that of the first capacitor.

The current memory cell may further include a resistor coupled between the first and second nodes.

According to an exemplary embodiment of the present invention, there is provided a current mode digital-to-analog converter, including: a reference current source; a refresh control unit configured to output first and second control signals; a current control unit configured to output a plurality of selection signals, in response to a data signal; a coupling control unit configured to couple output lines and a first current supply line, in response to the plurality of selection signals; and a plurality of current memory cells configured to supply a current to the output lines, wherein at least one of the current memory cells includes: an amplifier including a first input terminal, a second input terminal and an output terminal; a transistor including a source electrode coupled to a first node, a drain electrode coupled to a ground, and a gate electrode coupled to a second node; a first capacitor coupled between the second node and the ground; a second capacitor coupled between a third node and the ground; a first switching unit configured to couple the reference current source to the first node in response to the first control signal and couple a corresponding output line among the output lines to the first node in response to the second control signal; a second switching unit configured to couple the first node to the second node in response to the first control signal; and a third switching unit configured to couple the first input terminal of the amplifier to the second node and couple the second input terminal of the amplifier and the output terminal of the amplifier to the third node in response to the first control signal, and couple the first input terminal of the amplifier to the third node and couple the second input terminal of the amplifier and the output terminal of the amplifier to the second node in response to the second control signal.

The coupling control unit may also be configured to couple the output lines and a second current supply line, in response to inversion signals of the plurality of selection signals.

The coupling control unit may include a plurality of first current supply control transistors each turned on in response to a corresponding selection signal among the plurality of selection signals; and a plurality of second current supply control transistors each turned on in response to a corresponding inversion signal among the inversion signals.

According to an exemplary embodiment of the present invention, there is provided a current memory cell including a first switching unit configured to provide a reference current to a first node during a first period and couple an output line to the first node during a second period, a second switching unit configured to couple the first node to a second node during the first period, and a third switching unit configured to couple a positive input terminal of an amplifier to the second node and couple a negative input terminal of the amplifier and an output terminal of the amplifier to a third node during the first period, and couple the positive input terminal of the amplifier to the third node and couple the negative input terminal of the amplifier and the output terminal of the amplifier to the second node during the second period, wherein the first node is disposed between the first switching unit and a ground, the second node is disposed between the first node and the third switching unit and the third node is disposed between the third switching unit and the ground.

The current memory cell may further include a transistor disposed between the first node and the ground.

The current memory cell may further include a first capacitor disposed between the second switching unit and the ground.

The current memory cell may further include a second capacitor disposed between the third node and the ground.

A capacitance of the second capacitor may be greater than that of the first capacitor.

The first switching unit, the second switching unit and the third switching unit may operate in response to a first control signal in the first period.

The first switching unit and the third switching unit may operate in response to a second control signal in the second period.

The first control signal may enabled during the first period and disabled during the second period and the second control signal may be disabled during the first period and enabled during the second period.

BRIEF DESCRIPTION OF THE DRAWINGS

The above and other features of the present invention ill become more apparent by describing in detail exemplary embodiments thereof with reference to the accompanying drawings.

DETAILED DESCRIPTION OF THE EMBODIMENTS

Figure 1:
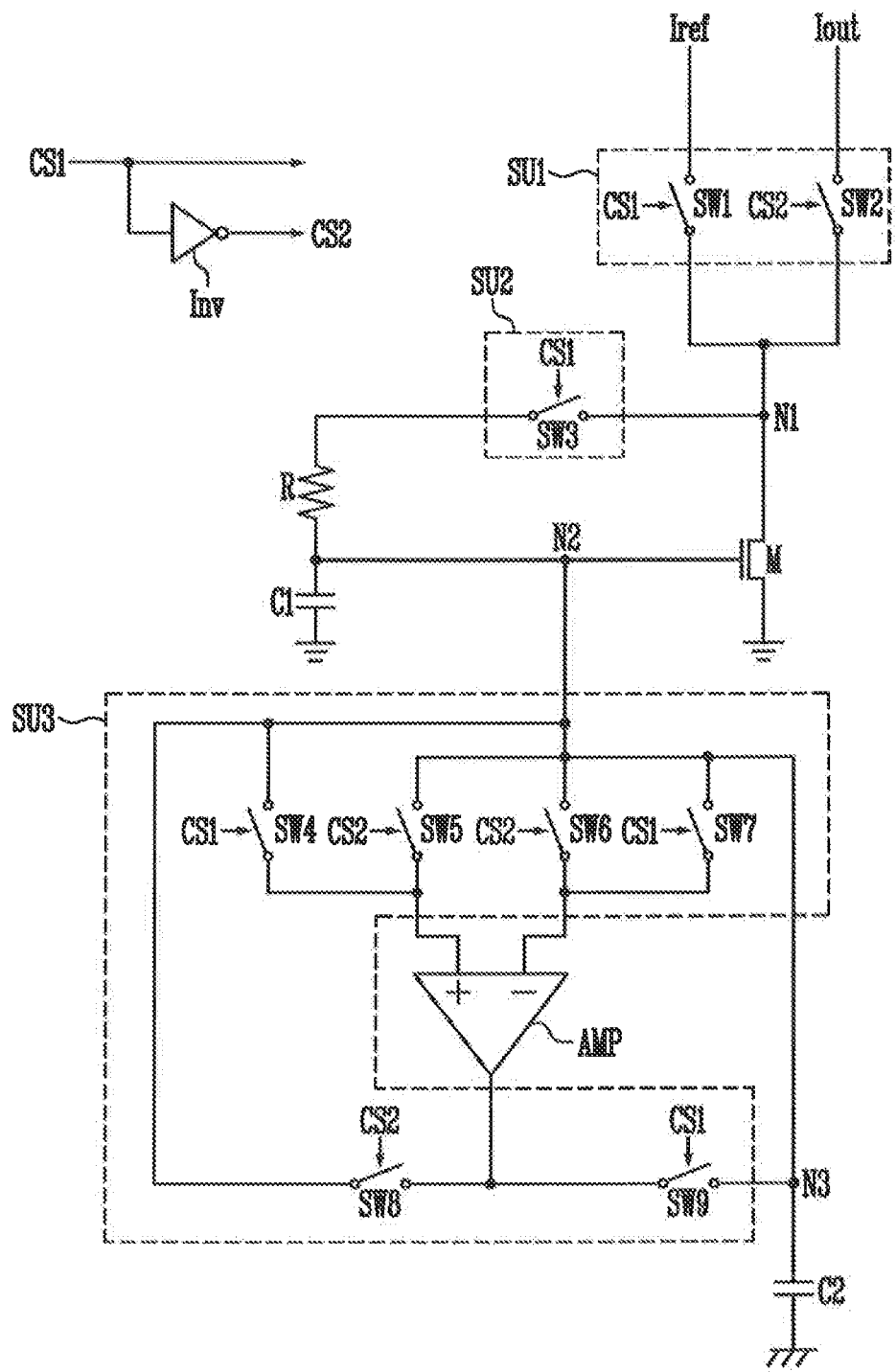
FIG. 1 is a circuit diagram illustrating a current memory cell according to an exemplary embodiment of the present invention.

Hereinafter, exemplary embodiments of the present invention will be described with reference to the accompanying drawings. The invention may however, be embodied in many different forms and should not be construed as being limited to the embodiments set forth herein. Here, when a first element is described as being coupled to a second element, the first element may be directly coupled to the second element or indirectly coupled to the second element via a third element. In the drawings, dimensions of the elements may be exaggerated for clarity. In addition, like reference numerals in the drawings and specification may refer to like elements.

FIG. 1 is a circuit diagram illustrating a current memory cell 10 according to an exemplary embodiment of the present invention.

Referring to FIG. 1, the current memory cell 10 includes an amplifier AMP, a transistor M, a plurality of capacitors C1 and C2, and a plurality of switching units SU1 to SU3.

The amplifier AMP includes a first input terminal, a second input terminal and an output terminal. The first input terminal of the amplifier AMP is coupled to fourth and fifth switching elements SW4 and SW5 of the third switching unit SU3. The second input terminal of the amplifier AMP is coupled to sixth and seventh switching elements SW6 and SW7 of the third switching unit SU3. The output terminal of the amplifier AMP is coupled to eighth and ninth switching elements SW8 and SW9 of the third switching unit SU3.

The transistor M has a source electrode coupled to a first node N1, a drain electrode coupled to a ground, and a gate electrode coupled to a second node N2.

The first capacitor C1 is coupled between the second node N2 and the ground, and the second capacitor C2 is coupled between a third node N3 and the ground.

The first switching unit SU1 is coupled among a reference current source (IREF of FIG. 4), an output line Iout and the first node N1. The first switching unit SU1 selectively couples any one of the reference current source (IREF of FIG. 4) and the output line Iout to the first node N1. For example, the first switching unit SU1 couples the reference current source IREF to the first node N1 during a first period, and couples the output line Iout to the first node N1 during a second period.

Here, the first period may be a period in which a first control signal CS1 is supplied, and the second period may be a period in which a second control signal CS2 is supplied.

Figure 4:
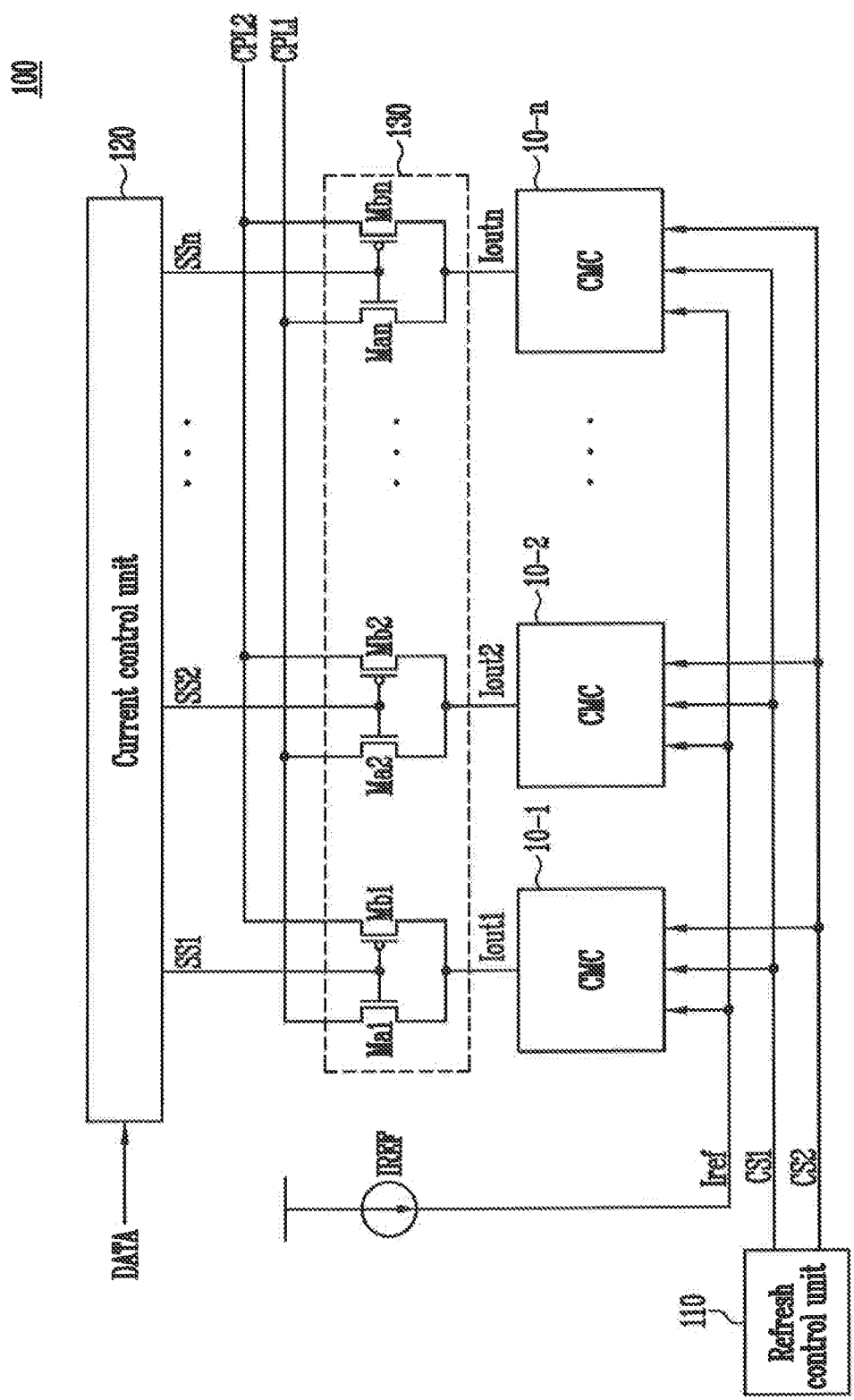
FIG. 4 is a block diagram illustrating a current mode digital-to-analog converter including the current memory cell shown in FIG. 1, according to an exemplary embodiment of the present invention.

The first and second control signals CS1 and CS2 are signals which are alternate with each other. According to an exemplary embodiment of the present invention, the current memory cell 10 may further include an inverter Inv configured to generate the second control signal CS2 by inverting the first control signal CS1 (see upper left side of FIG. 1). According to an exemplary embodiment of the present invention, the first and second control signals CS1 and CS2, as shown in FIG. 4, may be supplied from outside of the current memory cell 10, e.g., from a refresh control unit 110.

The first switching unit SU1 includes a first switching element SW1 and a second switching element SW2. The first switching element SW1 is coupled between the reference current source IREF and the first node N1. The first switching element SW1 is turned on in response to the first control signal CS1. The second switching element SW2 is coupled between the output line Iout and the first node N1. The second switching element SW2 is turned on in response to the second control signal CS2.

The second switching unit SU2 is coupled between the first and second nodes N1 and N2. The second switching unit SU2 allows the first and second nodes N1 and N2 to be coupled to each other during the first period. The second switching unit SU2 includes a third switching element SW3. The third switching element SW3 is coupled between the first and second nodes N1 and N2. The third switching element SW3 is turned on in response to the first control signal CS1.

The third switching unit SU3 is coupled among the amplifier AMP, the second node N2 and the third node N3. The third switching unit SU3, during the first period, couples the first input terminal of the amplifier AMP to the second node N2, and couples the second input terminal and the output terminal of the amplifier AMP to the third node N3. The third switching unit SU3, during the second period, couples the first input terminal of the amplifier AMP to the third node N3, and couples the second input terminal and the output terminal of the amplifier AMP to the second node N2. The third switching unit SU3 includes a plurality of switching elements SW4 to SW9.

The fourth switching element SW4 is coupled to the second node N2 and the first input terminal of the amplifier AMP. The fourth switching element SW4 is turned on in response to the first control signal CS1. In other words, the fourth switching element SW4 allows the second node N2 and the first input terminal of the amplifier AMP to be coupled to each other during the first period.

The fifth switching element SW5 is coupled to the third node N3 and the first input terminal of the amplifier AMP. The fifth switching element SW5 is turned on in response to the second control signal CS2. In other words, the fifth switching eluent SW5 allows the third node N3 and the first input terminal of the amplifier AMP to be coupled to each other during the second period.

The sixth switching element SW6 is coupled to the second node N2 and the second input terminal of the amplifier AMP. The sixth switching element SW6 is turned on in response to the second control signal CS2. In other words, the sixth switching element SW6 allows the second node N2 and the second input terminal of the amplifier AMP to be coupled to each other during the second period.

The seventh switching element SW7 is coupled to the third node N3 and the second input terminal of the amplifier AMP. The seventh switching element SW7 is turned on in response to the first control signal CS1. In other words, the seventh switching element SW7 allows the third node N3 and the second input terminal of the amplifier AMP to be coupled to each other during the first period.

The eighth switching element SW8 is coupled to the second node N2 and the output terminal of the amplifier AMP. The eighth switching element SW8 is turned on in response to the second control signal CS2. In other ds, the eighth switching element SW8 allows the second node N2 and the output terminal of the amplifier AMP to be coupled to each other during the second period.

The ninth switching element SW9 is coupled to the third node N3 and the output terminal of the amplifier AMP. The ninth switching element SW9 is turned on in response to the first control signal CS1. In other words, the ninth switching element SW9 allows the third node N3 and the output terminal of the amplifier AMP to be coupled to each other during the first period.

According to an exemplary embodiment of the present invention, the current memory cell 10 may further include a resistor R. The resistor R may be coupled between the second switching unit SU2 and the second node N2. The resistor R can decrease a sudden change in voltage inside the current memory cell 10.

Hereinafter, an operation of the current memory cell 10 will be described with reference to FIGS. 2 and 3.

Figure 2:
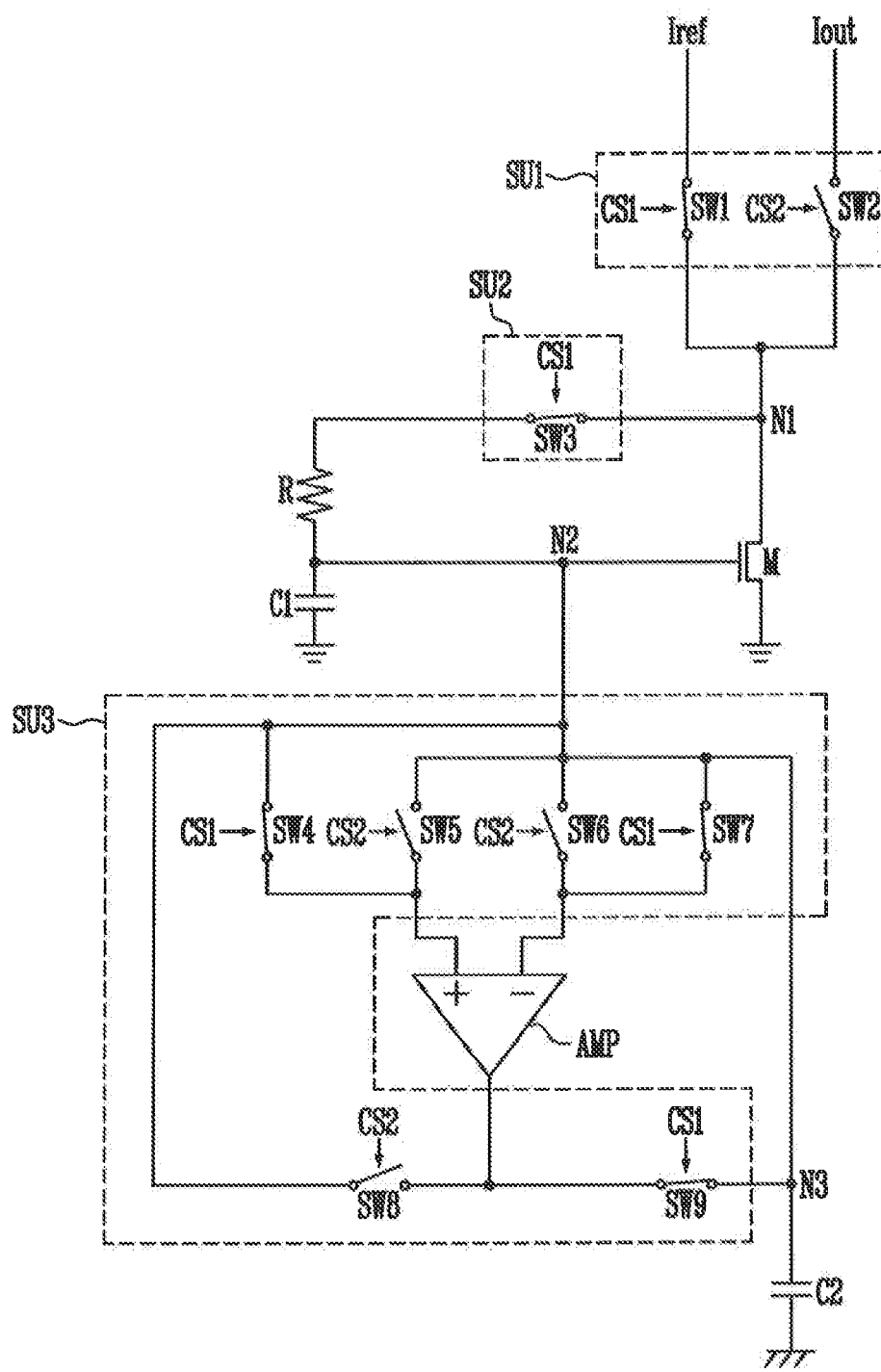
FIG. 2 is a circuit diagram illustrating an equivalent circuit of the current memory cell shown in FIG. 1 during a first period, according to an exemplary embodiment of the present invention.

FIG. 2 is a circuit diagram illustrating an equivalent circuit 10a of the current memory cell shown in FIG. 1 during a first period, according to an exemplary embodiment of the present invention. FIG. 3 is a circuit diagram illustrating an equivalent circuit 10b of the current memory cell shown in FIG. 1 during a second period, according to an exemplary embodiment of the present invention.

Referring to FIG. 2, the first, third, fourth, seventh and ninth switching elements SW1, SW3, SW4, SW7 and SW9 are turned on in response to the first control signal CS1 during the first period.

During the first period, a reference current Iref is supplied from the reference current source IREF to the second node N2 through the resistor R. Thus, the first capacitor C1 charges a voltage corresponding to the reference current Iref.

In a case where the amplifier AMP is ideal, the voltages of the first and second input terminals of the amplifier AMP are maintained equal to each other by a virtual short circuit. In other words, the voltages of the second and third nodes N2 and N3 are maintained equal to each other. Thus, the voltage of the third node N3 becomes equal to that charged in the first capacitor C1. In other words, the voltage charged in the second capacitor C2 becomes equal to that charged in the first capacitor C1.

In a case where the amplifier AMP is not ideal, the voltage of the first input terminal of the amplifier AMP becomes equal to that of the second input terminal of the amplifier AMP after a certain time elapses.

The time of the first period may be no less than the time when the voltage of the first input terminal of the amplifier AMP is equal to that of the second input terminal of the amplifier AMP.

Figure 3:
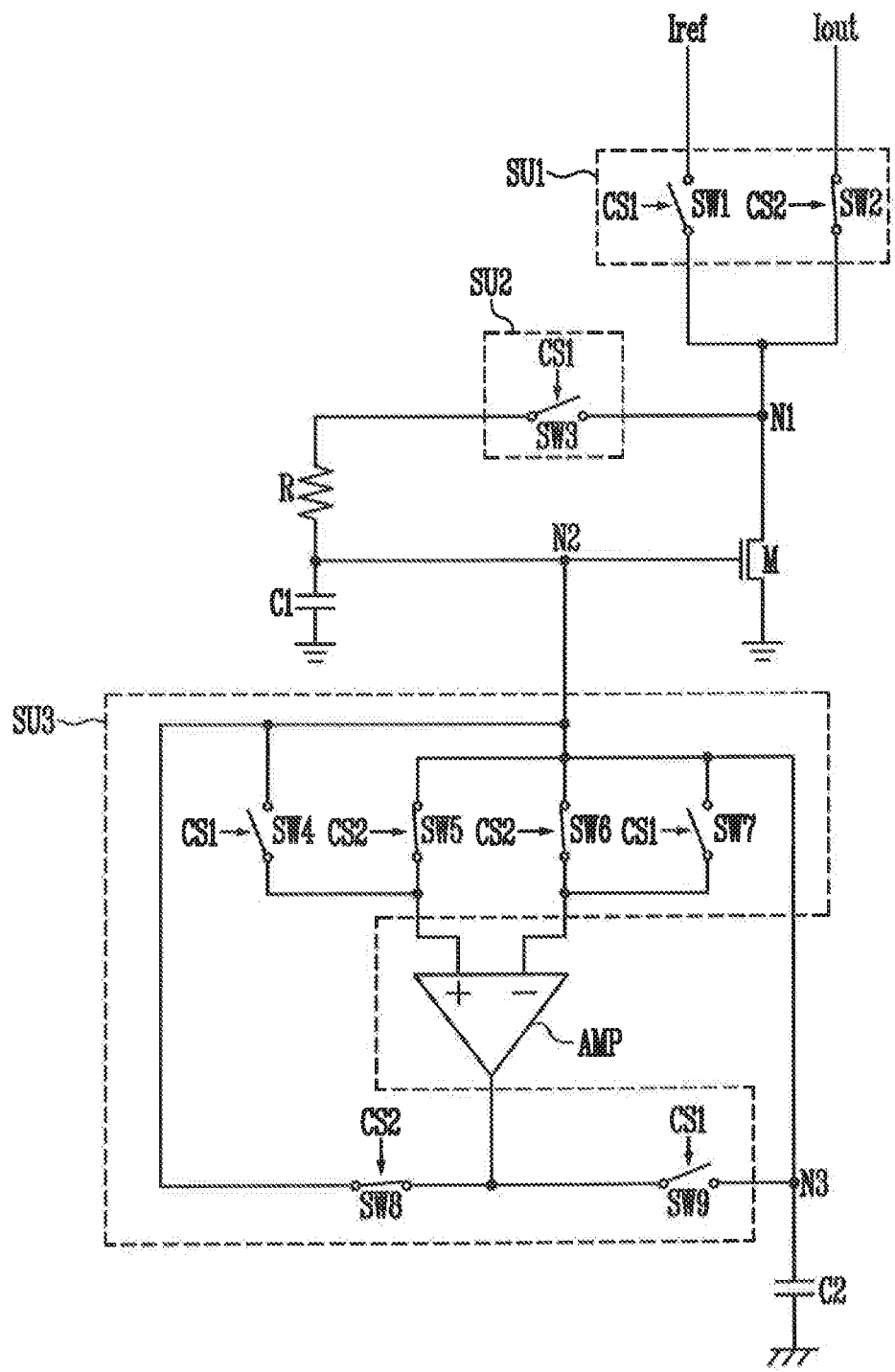
FIG. 3 is a circuit diagram illustrating an equivalent circuit of the current memory cell shown in FIG. 1 during a second period, according to an exemplary embodiment of the present invention.

Referring to FIG. 3, the second, fifth, sixth and eighth switching elements SW2, SW5, SW6 and SW8 are turned on in response to the second control signal CS2 during the second period.

During the second period, the transistor M supplies, to the output line Iout, current in proportion to the voltage of the second node N2.

During the second period, the voltages of the second and third nodes N2 and N3 are maintained equal to each other according to the characteristic of the amplifier AMP. In other words, the voltage charged in the second capacitor C2 is maintained equal to that charged in the first capacitor C1. Thus, the voltage of the second node N2, e.g., the voltage charged in the first capacitor C1 can be constantly maintained, regardless of the current flowing in the output line Iout.

The voltage applied to the gate electrode of the transistor M, e.g., the voltage of the second node N2 is constantly maintained, and thus the transistor M can supply a constant current to the output line Iout.

The capacitance of the second capacitor C2 may be greater than that of the first capacitor C1 so that the voltage of the second node N2 is constantly maintained for a long period of time.

FIG. 4 is a block diagram illustrating a current mode digital-to-analog converter 100 including the current memory cell shown in FIG. 1, according to an exemplary embodiment of the present invention.

Referring to FIG. 4, the current mode digital-to-analog converter 100 includes the reference current source WEE a plurality of current memory cells 10-1 to 10-n, the refresh control unit 110, a current control unit 120 and a coupling control unit 130.

The reference current source IREF supplies the reference current Iref to the plurality of current memory cells 10-1 to 10-n.

Each of the plurality of current memory cells 10-1 to 10-n may be implemented as the current memory cell 10 shown in FIG. 1. In other words, during the first period, each of the plurality of current memory cells 10-1 to 10-n charges the capacitors C1 and C2, using the reference current Iref, in response to the first control signal CS1 output from the refresh control unit 110. Subsequently, during the second period, the plurality of current memory cells 10-1 to 10-n supply, respectively to output lines Iout1 to Ioutn, current corresponding to the voltage charged in the capacitors C1 and C2, in response to the second control signal CS2 output from the refresh control unit 110.

The refresh control unit 110 periodically supplies the first and second control signals CS1 and CS2 alternate with each other to the plurality of current memory cells 10-1 to 10-n. For example, the refresh control unit 110 supplies the first control signal CS1 during the first period and supplies the second control signal CS2 during the second period. The refresh control unit 110 supplies the first control signal CS1 during a time in which the capacitors C1 and C2 included in each of the plurality of current memory cells 10-1 to 10-n can be sufficiently charged, and supplies the second control signal CS2 during a time in which the current supplied from each of the plurality of current memory cells 10-1 to 10-n is constantly maintained.

The current control unit 120 outputs a plurality of selection signals SS1 to SSn to the coupling control unit 130, in response to a data signal DATA supplied from the outside of the current mode digital-to-analog converter 100. For example, when the data signal. DATA indicates a value corresponding to m current memory cells, the current control unit 120 outputs an m selection signal to the coupling control unit 130. For example, when the current supplied from one current memory cell is 1 mA, and the data signal DATA indicates 5 mA, the current control unit 120 outputs five selection signals to the coupling control unit 130.

The coupling control unit 130 controls couplings between the plurality of output lines Iout1 to Ioutn and a first current supply line CPL1, in response to the plurality of selection signals SS1 to SSn output from the current control unit 120. In addition, the coupling control unit 130 may control couplings between the plurality of output lines Iout1 to Ioutn and a second current supply line CPL2, in response to the inversion signals of the plurality of selection signals SS1 to SSn. The coupling control unit 130 may include a plurality of first current supply control transistors Ma1 to Man and a plurality of second current supply control transistors Mb1 to Mbn.

Each of the plurality of first current supply control transistors Ma1 to Man is coupled between the first current supply line CPL1 and a corresponding current memory cell among the plurality of current memory cells 10-1 to 10-n. Each of the plurality of first current supply control transistors Ma1 to Man is turned on in response to a corresponding selection signal among the plurality of selection signals SS1 to SSn.

Each of the plurality of second current supply control transistors Mb1 to Mbn is coupled between the second current supply line CPL2 and a corresponding current memory cell among the plurality of current memory cells 10-1 to 10-n. Each of the plurality of second current supply control transistors Mb1 to Mbn is turned on in response to the inversion signal of a corresponding selection signal among the plurality of selection signals SS1 to SSn.

The current mode digital-to-analog converter 100 configured as described above can supply currents with various amplitudes. For example, the current mode digital-to-analog converter 100 can be used to supply currents corresponding to various gray scales to each pixel of a current driven display such as an organic light emitting display.

In the current memory cell and the current mode digital-to-analog converter including the same according to an exemplary embodiment of the present invention, it is possible to decrease the refresh period.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A current memory cell, comprising:
an amplifier including a first input terminal, a second input terminal and an output terminal;
a transistor including a source electrode coupled to a first node, a drain electrode coupled to a ground, and a gate electrode coupled to a second node;
a first capacitor coupled between the second node and the ground;
a second capacitor coupled between a third node and the ground;
a first switching unit configured to couple a reference current source to to the first node during a first period and couple an output line to the first node during a second period;
a second switching unit configured to couple the first node to the second node during the first period; and
a. third switching unit configured to couple the first input terminal of the amplifier to the second node and couple the second input terminal of the amplifier and the output terminal of the amplifier to the third node during the first period, and couple the first input terminal of the amplifier to the third node and couple the second input terminal of the amplifier and the output terminal of the amplifier to the second node during the second period.

2. The current memory cell of claim 1, wherein the first period is a period in which a first control signal is supplied, and the second period is a period in which a second control signal is supplied.

3. The current memory cell of claim 2, wherein the first switching unit includes:
a first switching element coupled between the reference current source and the first node, the first switching element configured to be turned on in response to the first control signal; and
a second switching element coupled between the output line and the first node, the second switching element configured to be turned on in response to the second control signal.

4. The current memory cell of claim 3, wherein the second control signal is an inversion signal of the first control signal.

5. The current memory cell of claim 2, wherein the second switching unit includes a third switching element coupled between the first and second nodes, the third switching element configured to be turned on in response to the first control signal.

6. The current memory cell of claim 2, wherein the third switching unit includes:

a fourth switching element coupled between the second node and the first input terminal of the amplifier, the fourth switching element configured to be turned on in response to the first control signal;

a fifth switching element coupled between the third node and the first input terminal of the amplifier, the fifth switching element configured to be turned on in response to the second control signal;

a sixth switching element coupled between the second node and the second input terminal of the amplifier, the sixth switching element configured to be turned on in response to the second control signal;

a seventh switching element coupled between the third node and the second input terminal of the amplifier, the seventh switching element configured to be turned on in response to the first control signal;

an eighth switching element coupled between the second node and the output terminal of the amplifier, the eighth switching element configured to be turned on in response to the second control signal; and a ninth switching element coupled between the third node and the output terminal of the amplifier, the ninth switching element configured to be turned on in response to the first control signal.

7. The current memory cell of claim 2, further comprising an inverter configured to generate the second control signal by inverting the first control signal.

8. The current memory cell of claim 1, wherein the capacitance of the second capacitor is greater than that of the first capacitor.

9. The current memory cell of claim 1, further comprising a resistor coupled between the first and second nodes.

10. A current mode digital-to-analog converter, comprising:
a reference current source;
a refresh control unit configured to output first and second control signals;
a current control unit configured to output a plurality of selection signals, in response to a data signal;
a coupling control unit configured couple output lines and a first current supply line, in response to the plurality of selection signals; and
a plurality of current memory cells configured to supply a current to the output lines,
wherein at least one of the current memory cells includes:
an amplifier including a first input terminal, a second input terminal and an output terminal;
a transistor including a source electrode coupled to a first node, a drain electrode coupled to a ground, and a gate electrode coupled to a second node;
a first capacitor coupled between the second node and the ground;
a second capacitor coupled between a third node and the ground;
a first switching unit configured to couple the reference current source to the first node in response to the first control signal and couple a corresponding output line among the output lines to the first node in response to the second control signal;
a second switching unit configured to couple the first node to the second node in response to the first control signal; and
a third switching unit configured to couple the first input terminal of the amplifier to the second node and couple the second input terminal of the amplifier and the output terminal of the amplifier to the third node in response to the first control signal, and couple the first input terminal of the amplifier to the third node and couple the second input terminal of the amplifier and the output terminal of the amplifier to the second node in response to the second control signal.

11. The current mode digital-to-analog converter of claim 10, wherein the coupling control unit is configured to couple the output lines and a second current supply line, in response to inversion signals of the plurality of selection signals.

12. The current mode digital-to-analog converter of claim 1, wherein the coupling control unit includes:
a plurality of first current supply control transistors each turned on in response to a corresponding selection signal among the plurality of selection signals; and
a plurality of second current supply control transistors each turned on in response to a corresponding inversion signal among the inversion signals.

13. A current memory cell, comprising:
a first switching unit configured to provide a reference current to a first node during a first period and couple an output line to the first node during a second period,
a second switching unit configured to couple the first node to a second node during the first period, and
a third switching unit configured to couple a positive input terminal of an amplifier to the second node and couple a negative input terminal of the amplifier and an output terminal of the amplifier to a third node during the first period, and couple the positive input terminal of the amplifier to the third node and couple the negative input terminal of the amplifier and the output terminal of the amplifier to the second node during the second period,
wherein the first node is disposed between the first switching unit and a ground, the second node is disposed between the first node and the third switching unit and the third node is disposed between the third switching unit and the ground.

14. The current memory cell of claim 13, further comprising a transistor disposed between the first node and the ground.

15. The current memory cell of claim 13, further comprising a first capacitor disposed between the second switching unit and the ground.

16. The current memory cell of claim 15, further comprising a second capacitor disposed between the third node and the ground.

17. The current memory cell of claim 16, wherein a capacitance of the second capacitor is greater than that of the first capacitor.

18. The current memory cell of claim 13, wherein the first switching unit, the second switching unit and the third switching unit operate in response to a first control signal in the first period.

19. The current memory cell of claim 18, wherein the first switching unit and the third switching unit operate in response to a second control signal in the second period.

20. The current memory cell of claim 19, wherein the first control signal is enabled during the first period and disabled during the second period and the second control signal is disabled during the first period and enabled during the second period.

* * * * *